United States Patent
Doughty et al.

(10) Patent No.: US 8,810,416 B2
(45) Date of Patent: Aug. 19, 2014

(54) IONISING RADIATION DETECTOR

(75) Inventors: Peter Trevor Doughty, Clevedon (GB); Michael John Anderson, Havenstreet (GB); David Jeremy Prendergast, Crookes (GB); Ian Benson, Church Crookham (GB)

(73) Assignee: Radiation Watch Limited, LLC, Havenstreet (GB)

( * ) Notice: Subject to any disclaimer, the term of this patent is extended or adjusted under 35 U.S.C. 154(b) by 923 days.

(21) Appl. No.: 12/939,321

(22) Filed: Nov. 4, 2010

(65) Prior Publication Data

US 2011/0121980 A1    May 26, 2011

Related U.S. Application Data

(62) Division of application No. 10/564,587, filed as application No. PCT/GB2004/002980 on Jul. 9, 2004, now Pat. No. 7,902,976.

(30) Foreign Application Priority Data

Jul. 12, 2003   (GB) .................................... 0316372.2
Feb. 18, 2004   (GB) .................................... 0403513.5

(51) Int. Cl.
| | | |
|---|---|---|
| *G08B 17/12* | (2006.01) | |
| *G01T 1/02* | (2006.01) | |
| *G01T 1/24* | (2006.01) | |
| *G01T 1/36* | (2006.01) | |
| *H01L 27/146* | (2006.01) | |

(52) U.S. Cl.
CPC .................. *G01T 1/366* (2013.01); *G01T 1/026* (2013.01); *H01L 27/14634* (2013.01); *G01T 1/247* (2013.01); *H01L 27/14665* (2013.01)
USPC ...... 340/600; 340/539.26; 340/629; 340/632; 250/370.01; 250/370.07; 250/385.1; 250/395

(58) Field of Classification Search
CPC ............. G01T 1/247; G01T 1/40; G01T 1/28; G01T 1/026; G01T 1/18; G01T 1/00; G01T 1/185; G01T 7/00; G01T 1/02; G01T 1/17; G01T 1/24; G01T 1/16; G08B 21/12; G08B 3/10; H04N 5/32; H04N 5/355; H04N 5/37452; H04N 5/378
USPC .............. 340/539.26–539.29, 577–583, 600, 340/629, 632, 636.1, 636.19; 250/370.01, 250/370.07, 385.1, 395, 472.1
See application file for complete search history.

(56) References Cited

U.S. PATENT DOCUMENTS

| 5,812,191 A | 9/1998 | Orava et al. |
| 5,986,276 A | 11/1999 | Labriola, II |

(Continued)

FOREIGN PATENT DOCUMENTS

| JP | 20000206259 A | 7/2000 |
| JP | 2002350551 A | 12/2002 |
| WO | WO-02063339 A1 | 8/2002 |

OTHER PUBLICATIONS

Schwarz et al., "Measurements with Si and GaAs pixel detectors bonded to photon counting readout chips", *Nuclear Instruments & Methods in Physics Research*, 466(1):87-94 (2001).

(Continued)

*Primary Examiner* — George Bugg
*Assistant Examiner* — Sharmin Akhter
(74) *Attorney, Agent, or Firm* — Mintz Levin Cohn Ferris Glovsky and Popeo, P.C.

(57) ABSTRACT

An assembly (13) for monitoring ionising radiation comprises a detector substrate (2) for generating electronic charge responsive to incident ionising radiation, the detector substrate (2) having an array of ionising radiation sense volumes (12) formed in it. A circuit substrate (14) supporting an array of read-out circuits (16) corresponding to the array of sense volumes is mechanically and electrically coupled to the detector substrate (14). Each of the read-out circuits (16) is switchable between first and second charge integration modes for receiving charge from a corresponding sense volume. A charge integration circuit (30) is configured in the first charge integration mode to integrate charge corresponding to sensing of a single ionising radiation detection event in a corresponding sense volume and in the second charge integrating mode to integrate charge corresponding to sensing a plurality of ionising radiation detection events in the corresponding sense volume.

14 Claims, 16 Drawing Sheets

(56) References Cited

U.S. PATENT DOCUMENTS

| | | |
|---|---|---|
| 6,100,806 A | 8/2000 | Gaukel |
| 6,337,482 B1 | 1/2002 | Francke |
| 6,510,195 B1 * | 1/2003 | Chappo et al. ............... 378/19 |
| 6,707,045 B1 | 3/2004 | Sussmann et al. |
| 6,856,350 B2 * | 2/2005 | Orava et al. ................ 348/308 |
| 7,005,982 B1 | 2/2006 | Frank |
| 7,196,333 B1 | 3/2007 | Gerstenmayer et al. |
| 2001/0001562 A1 | 5/2001 | Orava et al. |
| 2002/0036269 A1 | 3/2002 | Shahar et al. |
| 2002/0079456 A1 | 6/2002 | Lingren et al. |
| 2002/0195572 A1 * | 12/2002 | Kitaguchi et al. ......... 250/472.1 |
| 2003/0031146 A1 * | 2/2003 | Sugaya ........................ 370/336 |
| 2003/0069002 A1 | 4/2003 | Hunter et al. |
| 2003/0155519 A1 * | 8/2003 | Francke et al. ............ 250/385.1 |
| 2005/0098730 A1 | 5/2005 | Yokoi et al. |

OTHER PUBLICATIONS

Eisen, "Current state-of-the-art industrial and research applications using room-temperature CdTe and CdZnTe solid state detectors", *Nuclear Instruments & Methods in Physics*, 380(12):4311-439 (1996).

* cited by examiner

Drawing exhibits the generic structure of the detector layer, its bonding to the CMOS recording layer and a diagrammatic representation of the cell structure

IONISING RADIATION DETECTOR

CROSS-REFERENCE TO RELATED APPLICATIONS

This application is a divisional application of U.S. patent application Ser. No. 10/564,587, filed Sep. 27, 2006, now U.S. Pat No. 7,902,976 entitled "Ionising Radiation Detector," which is a national stage entry of PCT Patent Application No. PCT/GB2004/002980 (PCT Publication No. WO 2005/008286), entitled "Ionising Radiation Detector," and filed Jul. 9, 2004, which in turn claims the benefit of GB patent applications 0316372.2, filed Jul. 12, 2003, and 0403513.5, filed Feb. 18, 2004, respectively, the contents of all of which are hereby incorporated by reference in their entireties.

FIELD

The present invention relates to a device for detecting ionising radiation, in particular but not exclusively to a device, method, system and network for monitoring and analysing ionising radiation.

BACKGROUND

In general ionising radiation is considered to be radiation within the energy range 5 KeV to 6 MeV and includes gamma rays, x-rays, beta-rays, alpha-rays and neutron beams. Devices for detecting ionising radiation are well-known for radiological protection and metrology, such as in health or nuclear physics as well as national/homeland security and anti-terrorist applications. The devices are one of two types, either passive detectors or electronic-based active detectors.

Passive detection systems use film (film-badges), thermo-luminescent detection (TLD) or photochromatic technologies (PC) as detector materials. Common to these detector technologies is that they register the presence of ionising radiation by a change of state. For example, a film exposed to ionising radiation goes dark when developed, TLD materials emit light when heated having previously been exposed to ionising radiation and PC materials change colour when irradiated with ionising radiation. However, the change of state of these materials requires special processing in order to be determined, for example developing the film or heating the TLD material. Consequently, only an historic monitoring and evaluation of radiation exposure can be obtained. It is not possible to achieve real-time monitoring and evaluation. Since no direct real-time monitoring or analysis is possible it is therefore necessary to infer what type of radiation exposure caused the change of state. Although such inference can be drawn based on experience, nevertheless it is not possible to precisely determine what type of radiation (spectroscopic information) has been sensed nor an estimate of radiation dose which takes into account such information. Additionally, known passive detection systems generally have poor sensitivity to ionising radiation.

Active detectors may be based upon silicon technology and generally comprise one, two or three PIN-diodes, each PIN-diode having a preset threshold level to signal an alarm relating to a minimum energy level of incident radiation. If more than one PIN-diode is used then different threshold levels may be preset corresponding to different radiation and energy levels thereby providing crude spectroscopic analysis of incident radiation. However, silicon has poor sensitivity to ionising radiation since it does not have a high atomic number (Z), therefore there is inefficient conversion of the incident radiation to electric current and devices using such technology suffer from poor signal to noise ratio.

Higher Z materials may be used for the diode, such as mercury iodide ($M_gI$) or lead iodide ($P_bI$), which have better radiation conversion efficiency. Optionally, high Z scintillator materials such as sodium iodide ($N_aI$) and caesium iodide ($C_sI$) may be used which are normally formulated of single large crystals. To overcome poor sensitivity, many ionising radiation detectors use a large area (often single detector crystals) of detector material, however this results in saturation of the detector material when irradiated by a high radiation flux.

Detectors using scintillator material are generally bulky. This is due to the fact that the mean free path (the average distance traveled by a photon before interaction) of medium energy photons in such materials results in the use of crystals of a few cubic cm rather than millimeters. Additionally space needs to be reserved for the photo-multiplier tubes or photo-diodes required to convert the light pulses to an electronic signal adequate for the subsequent processing circuitry. Another drawback with using scintillator detectors is that light is radiated in all directions and therefore much of the energy resulting from the conversion of the incident radiation to light in the crystal does not reach the photo-multiplier tube and detector circuitry, hence decreasing the signal to noise ratio of the final signal.

Use of semi-conductors with higher Z than silicon for detecting ionising radiation, for example cadmium telluride ($C_dT_e$) and cadmium zinc telluride ($C_dZ_nT_e$) is already known, for example in the Amptek Inc. detector XR-100T-$C_dT_e$. Generally, such detectors utilise a large slab (for example around 3 mm by 3 mm by 1 mm) of detector material with very fast read-out. However, such a large area, although sensitive, also limits the radiation flux intensities which can be detected since a large area detector has a tendency to saturate at high flux intensity. Such single crystal slab large area detectors rely on fast read-out, for example using a multi-channel analyser, to ensure that the signals transformed into single counted events result from single photo-electric interactions.

Typically wire bonding is used to electrically couple the detector substrate to the detector electronics. Such wires by virtual of the mechanical requirements of the connection are normally characterised by large capacitance values which mitigates against fast read-out, and also acts as an antenna and picks up spurious electrical signals thereby degrading the resultant signal to noise ratio. Additionally, the wire connections inherently introduce losses which limits the sensitivity of the detector.

Another drawback of known active detectors is that the electronic signals are generated remote from the detector substrate, leading to signal losses and signal mis-shaping due to the impedance of connecting wires and circuitry.

The present invention was devised with the foregoing in mind.

SUMMARY

Viewed from a first aspect the present invention provides an assembly for monitoring ionising radiation, comprising a detector substrate for generating electronic charge responsive to incident ionising radiation, said detector substrate configured to form an array of ionising radiation sense volumes, and a circuit substrate supporting an array of read-out circuits corresponding to said array of sense volumes. Each of said read-out circuits is switchable between first and second charge integration modes for receiving charge from a corresponding sense volume. The charge integration circuit is configured in the first charge integration mode to integrate charge corresponding to the sensing of a single ionising radiation detection event in a corresponding sense volume, and configured in said second charge integrating mode to integrate charge corresponding to sensing a plurality of ionising radiation detection events in said corresponding sense volume.

Viewed from a second aspect the present invention provides a method for operating an assembly configured in accordance with the first aspect. The method comprises:

a) integrating charge corresponding to sensing of a single ionising radiation event, and b) non-coincidental with step a) integrating charge corresponding to sensing of plural ionising radiation events.

Embodiments of the present invention in accordance with the first and second aspects as set forth above provide for the monitoring, recordal and analysis of two characteristics of incident ionising radiation by a single device. Firstly, a single ionising radiation detection event may be observed allowing for the energy of the incident radiation causing the detection event to be measured, and therefore spectral information may be determined which provides for isotopic identification. The second characteristic of incident radiation that may be measured is the dose rate since the charge integration continues over a relatively long period. Thus, in a single device it is possible to not only determine radiation dose but also identify the nature or isotope of the radiation source. This provides for enhanced radiation monitoring, evaluation and analysis.

Viewed from a third aspect the present invention provides an assembly for monitoring radiation, comprising a detector substrate for generating electronic charge responsive to incident radiation, the detector substrate configured to form an array of ionising radiation sense volumes, and a circuit substrate supporting an array of read-out circuits corresponding to said sense volumes. The read-out circuits comprise photon-counting circuitry which is electronically configurable to respond to a current pulse corresponding to the detection in the detector substrate of ionising radiation in a first energy range to increment a first count value or to respond to a current pulse corresponding to the detection in a detector substrate of ionising radiation in a second energy range to increment a second count value. Such an assembly provides for the monitoring of radiation energy level, i.e. spectral information and therefore isotopic identification, and dose rate using the same counting circuitry. Not only does this have the same advantages as may be associated with an assembly in accordance with the first aspect described above, but the identification of radiation energy is performed by the photon-counting circuitry itself, thereby requiring less off-chip processing. Furthermore, since the photon-counting circuitry is electronically configurable to respond to incident ionising radiation in first and second radiation ranges, then a single assembly may be used to monitor for more than one radiation energy level or isotope.

For example, the whole surface area of an assembly may be used to first detect or monitor for a first type of radiation, and then electronically configured to monitor for a second or further types of incident ionising radiation.

As will be appreciated, an assembly may be driven in a cyclical fashion to monitor for a wide range of energy levels or isotopes.

Furthermore, detection and analysis of individual isotopes may be achieved by first operating the assembly to monitor over a wide range of energy levels, and gradually reduce the energy range in order to "seek" or narrow in onto the identify of the incident radiation.

Viewed from a fourth aspect the present invention provides an assembly for monitoring radiation, comprising a detector substrate for generating electronic charge responsive to incident radiation, the detector substrate configured to form an array of ionising radiation sense volumes, and a circuit substrate supporting an array of read-out circuits corresponding to the sense volumes. A first of the read-out circuits includes photon-counting circuitry which responds to a current pulse corresponding to the detection in the detector of ionising radiation in a first energy range to increment a first value, and a second of the read-out circuits includes photon-counting circuitry which responds to a current pulse corresponding to the detection in the detector substrate of ionising radiation in a second energy range to increment a second count value. Thus within a single assembly it is possible to monitor for more than one radiation energy level and thereby identify more than one isotope at the same time.

For the avoidance of doubt, the current pulse referred to in connection with the third and fourth aspects of the invention is the flow of charge generated by a radiation detection event in the detector substrate from the detector substrate to the read-out circuitry.

Viewed from a fifth aspect the present invention provides an ionising radiation dosimitor comprising a semi-conductor detector substrate crystal configured with a plurality of ionising radiation sense volumes. The detector substrate crystal supports conductive material across a first surface thereof and an array of conductive pads across a second surface thereof. The array of conductive pads define a plurality of sense volumes. This plurality of sense volumes provides for individual compensation of the characteristics of that individual sense volume when calibrating the assembly. Thus, if a section of the crystal is damaged then signals corresponding to sense volumes within the damaged area may be appropriately modified to account for the effect of such damage, and therefore the nature of the radiation incident on that damaged area may be correctly identified and measured. This is a considerable improvement over dosimitors which use large slabs of crystal without any division into separate sense volumes, since any incident radiation on a damaged area would merely produce a poor signal. It would not be possible to calibrate for incident radiation occurring in that damaged area.

Viewed from a sixth aspect the present invention provide a circuit substrate for a dosimitor such as described above, which is configured to receive charge from the ionising radiation detector substrate. The circuit substrate comprises an array of read-out circuits, each of the read-out circuits being switchable between first and second charge accumulation modes. The first charge accumulation mode being operable to accumulate charge corresponding to a single detection event and the second charge accumulation mode being operable to accumulate charge corresponding to a plurality of detection events.

In accordance with a seventh aspect of the invention there is provided a circuit substrate for a dosimitor configured to receive charge from an ionising radiation detector substrate in which the circuit substrate comprises an array of read-out circuits including photon-counting circuitry. The photon-counting circuitry may be preset or electronically configurable to respond to a current pulse corresponding to the detection in a detector substrate of ionising radiation in a first energy range to increment a first count value or to respond to a current pulse corresponding to the detection in a detector substrate of ionising radiation in a second energy range to increment a second count value.

Viewed from an eighth aspect there is provided an ionising radiation monitoring network comprising at least one ionising radiation monitoring device including a communications unit for communicating at least radiation data corresponding to radiation sensed by the device over a communications network. The radiation monitoring network also comprises a control station which is configured to receive the radiation data from the device. Such a network may provide a wide area monitoring for radiation such as in an urban environment, in order to provide "plume" analysis following any radiation event or to monitor for unusual instances of radiation.

It is particularly useful if the device in the radiation network can provide radiation data which includes spectroscopic data regarding the sensed radiation, and transmit that spectroscopic data to the control station. Such an arrangement further enhances the monitoring of the radiation environment. In particular, it mitigates against false alarms since the exact nature of the radiation may be determined, and a decision made as to whether it comprises hazardous or non-hazardous radiation.

Devices including wireless communication modules are particularly useful since they provide for a network in which the devices may be moved around. Such a network may be formed of emergency services personnel wearing detector devices for example. In such a mobile network the provision of a two-way communication module for two communication between the device and a control centre is particularly advantageous since a warning may be transmitted, for example automatically transmitted, to an ionising radiation sensor device for alerting a user of the sensor device to the presence of hazardous radiation.

In accordance with a ninth aspect of the present invention, a network such as described above may be used to monitor the position of ionising radiation, and to display the position and data such that a "plume" analysis of a radiation contaminated environment may be undertaken.

Specific embodiments of the present invention will now be described, by way of example only, and with reference to the accompanying drawings briefly described in the list of figures below.

LIST OF FIGURES

Figure 7A:
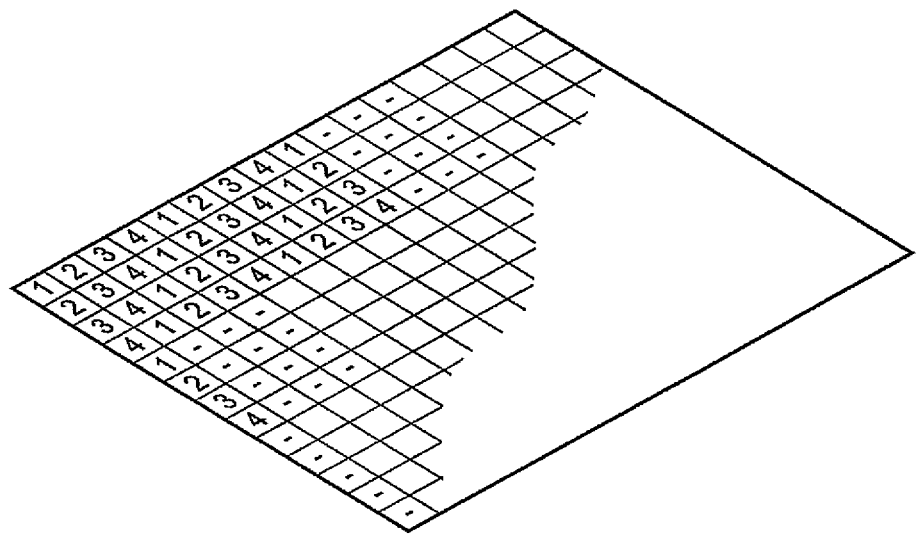
Figure 7B:
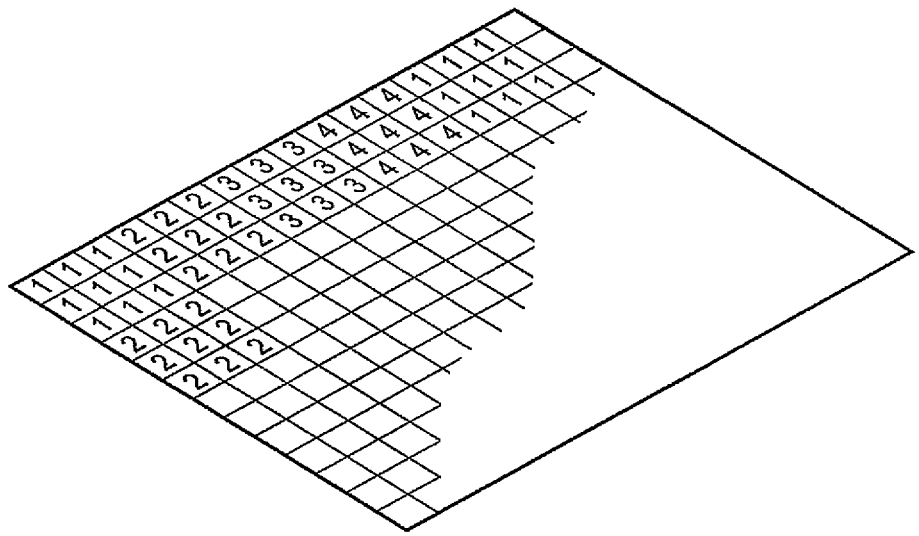
Figure 7C:
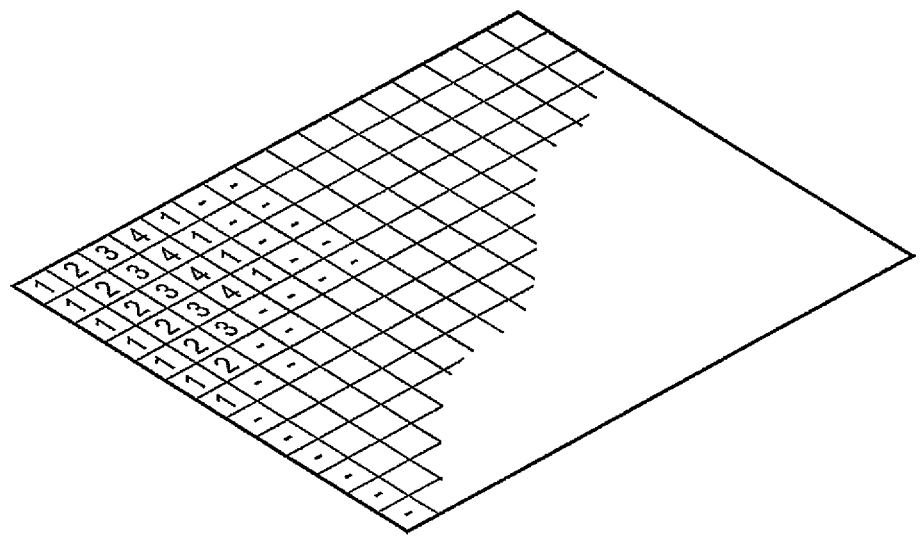
Figure 9:
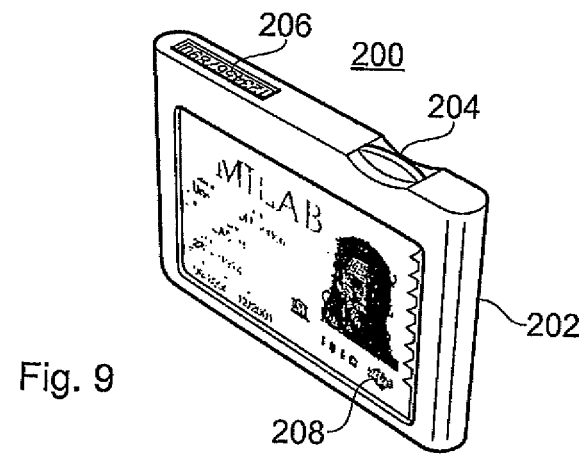
Figure 10:
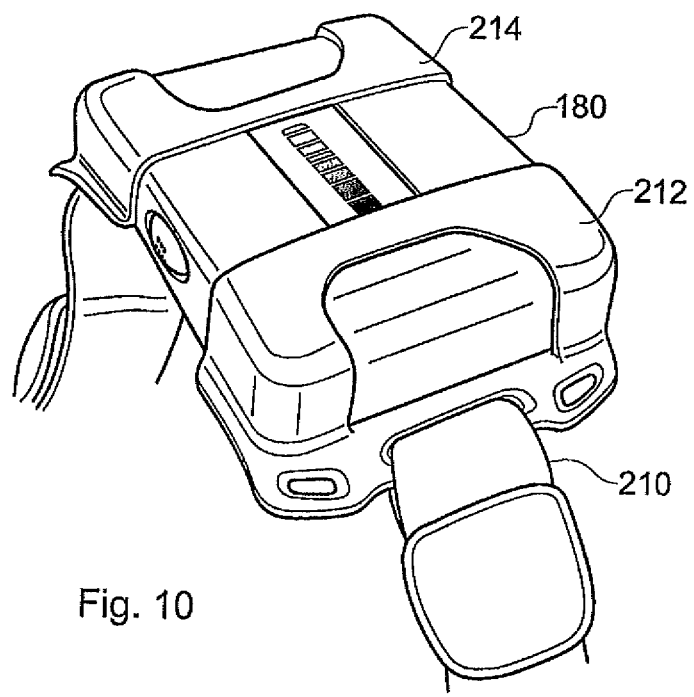
Figure 11:
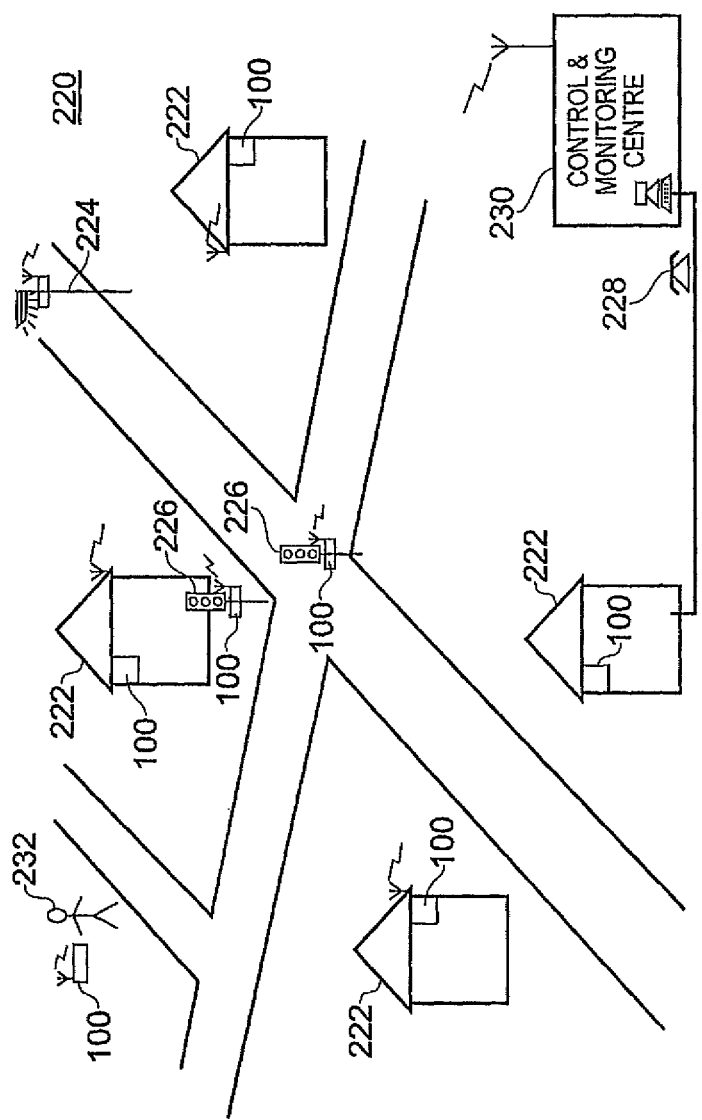
Figure 12:
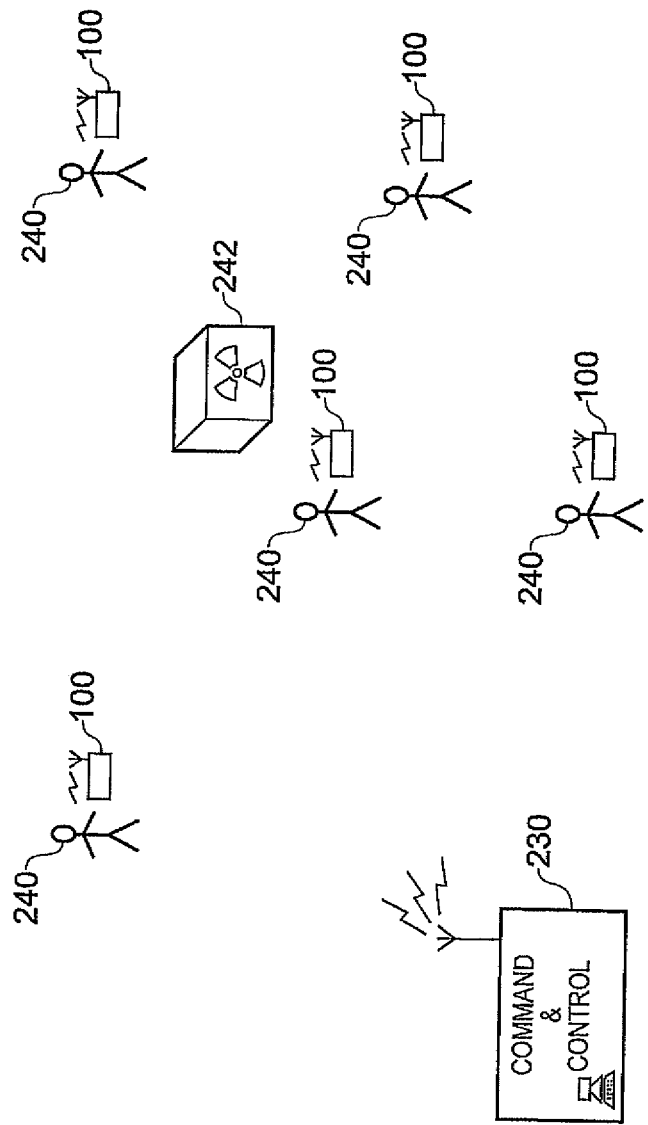
Figure 13:
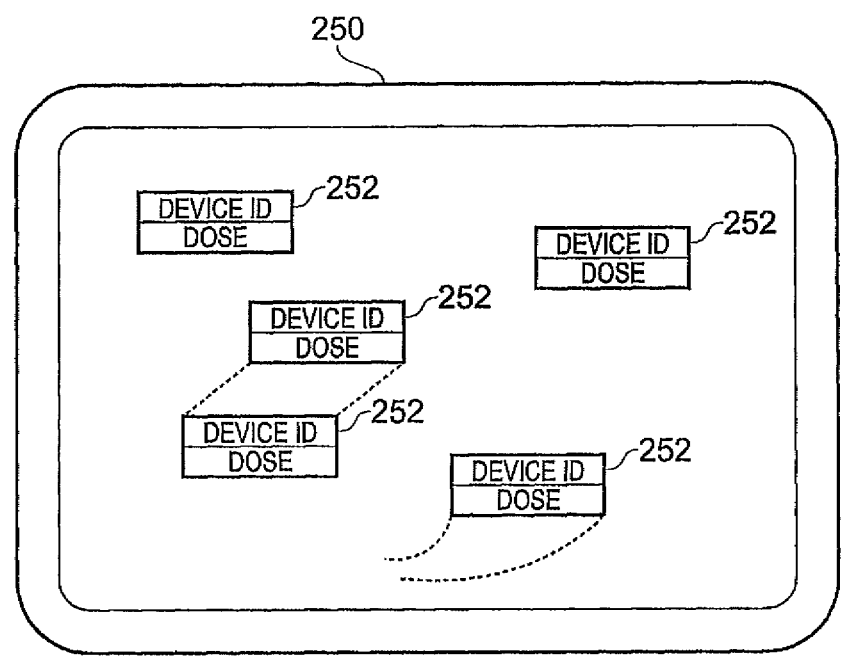
Figure 14:
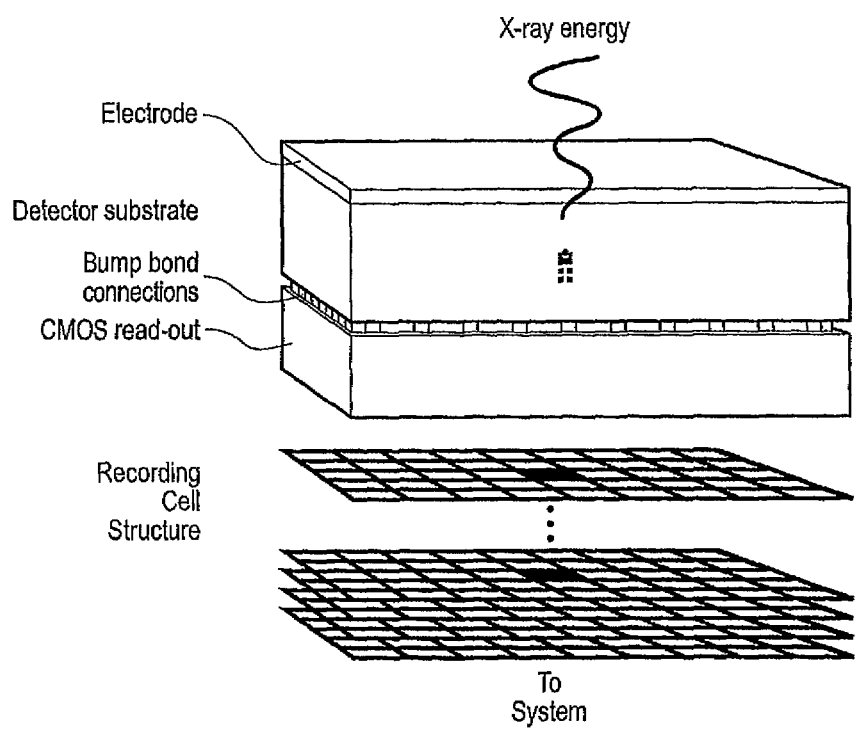
Figure 15:
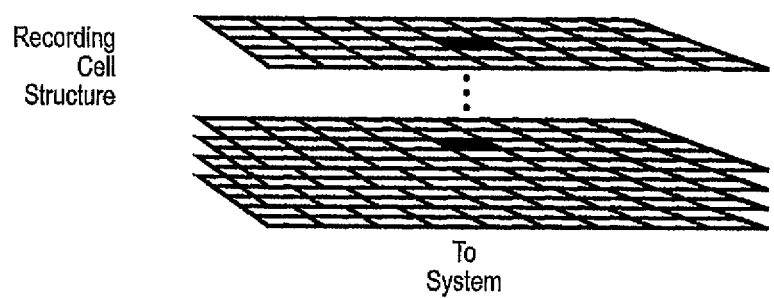
Figure 16:
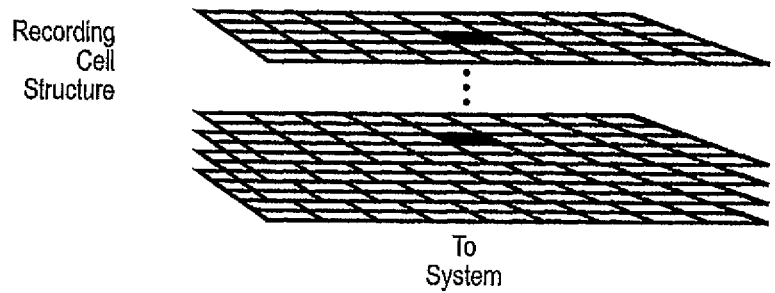
Figure 17:
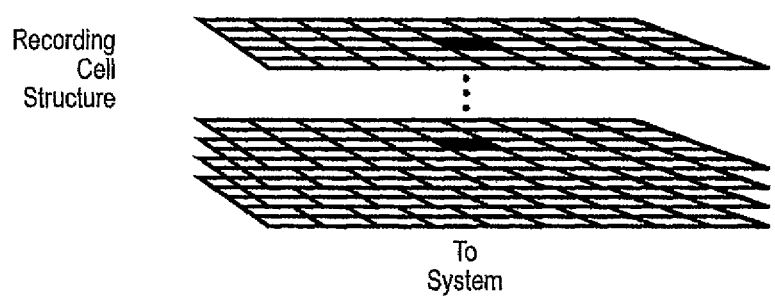

FIGS. 7(a)-(c) schematically illustrate different distributions of circuits having sensitivity to ionising radiation of different energy levels;

FIG. 8 illustrates an Isotopic Personal Dosimeter in accordance with an embodiment of the invention;

FIG. 9 illustrates another embodiment of an Isotopic Personal Dosimeter in accordance with the invention;

FIG. 10 illustrates a wearable arrangement for an Isotopic Personal Dosimeter in accordance with an embodiment of the invention;

FIG. 11 schematically illustrates a radiation monitoring network in an urban environment;

FIG. 12 schematically illustrates deployment of a wireless enabled radiation monitoring network;

FIG. 13 illustrates a display for a radiation monitoring network such as illustrated in FIGS. 11 and 12;

FIG. 14 is a schematic illustration of a detector and recording cell structure for an embodiment of the invention;

FIG. 15 illustrates a tessellated area of single energy resolution for an embodiment of the invention;

FIG. 16 illustrates a single line function of pixels with differing energy thresholds allowing multi-energy operation for an embodiment of the invention; and FIG. 17 illustrates a large tessellated area making a super pixel for an embodiment of the invention.

DETAILED DESCRIPTION

A detector substrate 2 in accordance with an embodiment of the present invention has a semi-conductor crystal 4 clad on a first surface thereof with a conductive material 6. The conductive cladding 6 is on a surface of the semi-conductor crystal 4 upon which ionising radiation is incident during use of the detector substrate 2. In the illustrated example the semi-conductor crystal 4 is $C_dT_e$ but other suitable semi-conductor materials may be used, such as CZT, $S_i$, $G_aA_s$, $C_dM_gT_e$.

The surface of the detector crystal 4 opposite the conductive cladding 6 has an array of conductive contact pads 10 deposited over it. Each conductive pad 10 is electrically isolated from the other contact pads. An array of pads 10 and conductive layer 6 forms an array of ionising radiation sense volumes 12. In the illustrated example an array of 50×50 sense volumes 12 is created from an array of conductive contact pads, each pad having dimensions 100 microns by 100 microns. Typically the contact pads are square, but they could be any other suitable shape such as triangular, hexagonal or other polygonal shape or circular, for example.

The conductive material for both the conductive cladding and conductive contact pads may be any suitable material for depositing on a semi-conductor, in particular a high Z semi-conductor, and may comprise aluminium (Al), gold (Au), or platinum (Pt) for example.

Figure 1:
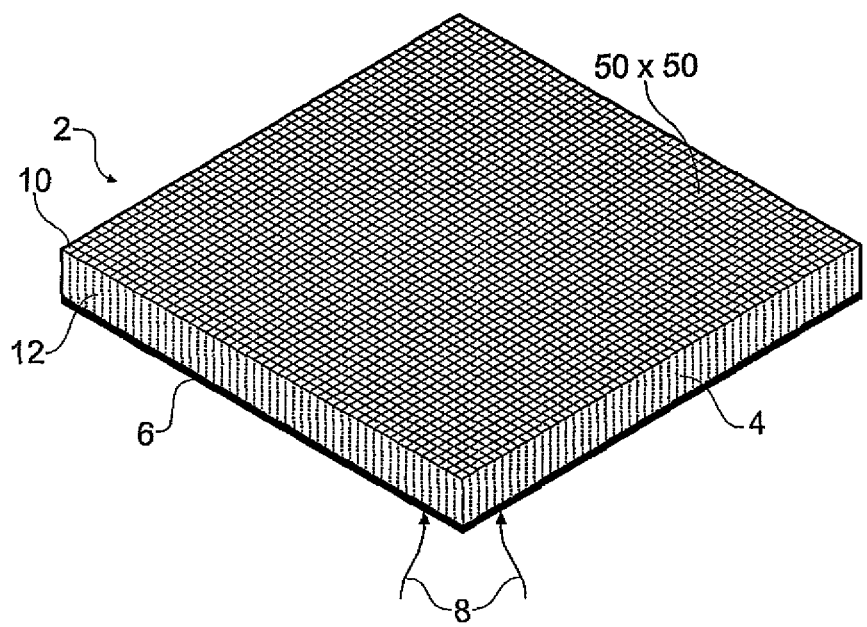
FIG. 1 illustrates a detector substrate in accordance with an embodiment of the invention.
Figure 2:
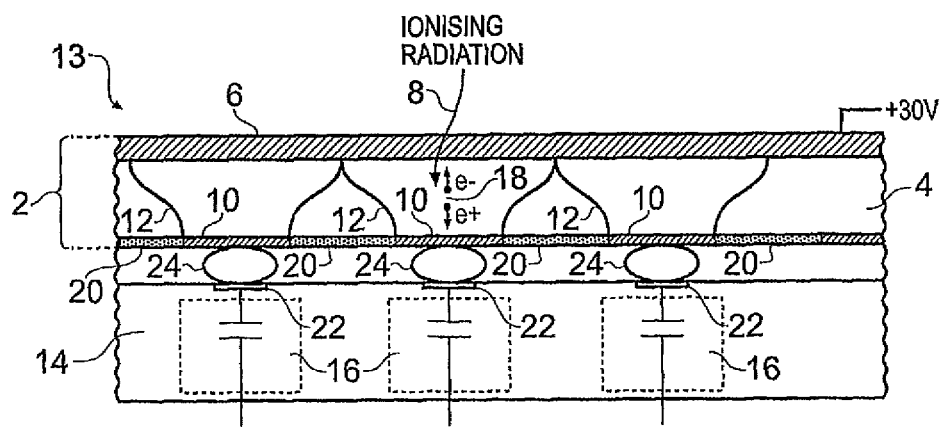
FIG. 2 illustrates a cross-section of a detector having the detector substrate illustrated in FIG. 1 coupled to a circuit substrate in accordance with an embodiment of the invention.

A cross-section of a detector device 13 comprising a detector substrate 2, as illustrated in FIG. 1, and a semi-conductor circuit substrate 14 is illustrated in FIG. 2. In use a bias voltage, for example 300 volts (other bias levels may be used suitable for the detector substrate material in use), is applied across the conductive layer 6 and conductive pads 10 which form sense volumes 12. The applicant has coined the term "voxor" (volume sensor) to refer to a sense volume comprising the three dimensional energy collection cell within the detector and the ASIC collection circuitry.

Ionising radiation 8 incident on the detector 13 forms an electron-hole pair 18 in a sense volume 12 (referred to herein as a detection event) and the bias voltage causes the positive and negative charges to migrate to contact pads 10 and conductive layer 6 respectively.

In the illustrated embodiment the electrically isolating space between contact pads 10 is filled with a passivation material 20, for example aluminium nitride, to enhance the electrical separation and isolation of the contact pads 10 from each other.

Circuit substrate 14 supports an array of read-out circuits 16, there being a corresponding number of read-out circuits 16 to the number of sense volumes 12. Each read-out circuit 16 includes a circuit contact 22 for electrically coupling the read-out circuitry 16 to the detector substrate 2. A conductive bond 24 couples the detector substrate 2 to the circuit substrate 14 to form the hybrid detector 13.

In the illustrated embodiment, bonding of the detector substrate 2 to circuit substrate 14 is by way of bump-bonding. The bump-bonds 24 both mechanically and electrically couple the detector and circuit substrates together. The mechanical coupling of the bump-bonding is often augmented by the practice of "under filling" in such detectors i.e. a low viscosity insulating epoxy resin is introduced into the space between bumps. The bump-bonds 24 are made of a low temperature solder such as a tin-bismuth mixture, which is particularly suitable for use with the $C_dT_e$ detector material used in the described embodiment, since $C_dT_e$ (and $C_dZ_nT_e$) is sensitive to heating and can be damaged if subjected to high temperatures, for example over 200° C. The chemicals suitable for growing bumps which fulfil this low temperature criterion are generally available from industrial sources.

The read-out substrate in the described embodiment supports CMOS circuitry and is configured as an ASIC. However, embodiments of the invention need not be limited to CMOS ASICs, but may use other substrate technologies including printing circuit board (PCB) technologies.

An advantage of having an array of relatively small cross-section sense volumes is that "hole trapping" is reduced. "Hole trapping" is the phrase used to describe the phenomenon of holes becoming locked in deep levels within the semi-conductor forbidden band. It is a common problem observed with semiconductors. The resultant partial charge collection results in low resolution of the gamma energy. According to the small pixel theory (see papers by Barrett et al. [1] and Eskin et al. [2]) the signal contribution related to electrons dominates over the contribution from the holes in detectors having small detector volume cross-section such as pixellated detectors. This leads to an improvement in energy resolution with reduction of the aspect ratio of the sensing volume side to its thickness. The rationale is as follows. Due to hole trapping and field effects the induced charge relates to the electron flow from interactions relatively close to the read-out circuit input (i.e. conductive pad of the detector substrate). However, the holes flow towards the common negative contact. Consequently, their cumulative contribution is distributed over a number of sense volumes, thereby effectively excluding the hole contribution from a single sense volume signal. The net effect is that detectors formed of an array of sense volumes ("pixellated") will generally provide better energy resolution than slab based approaches.

Figure 3:
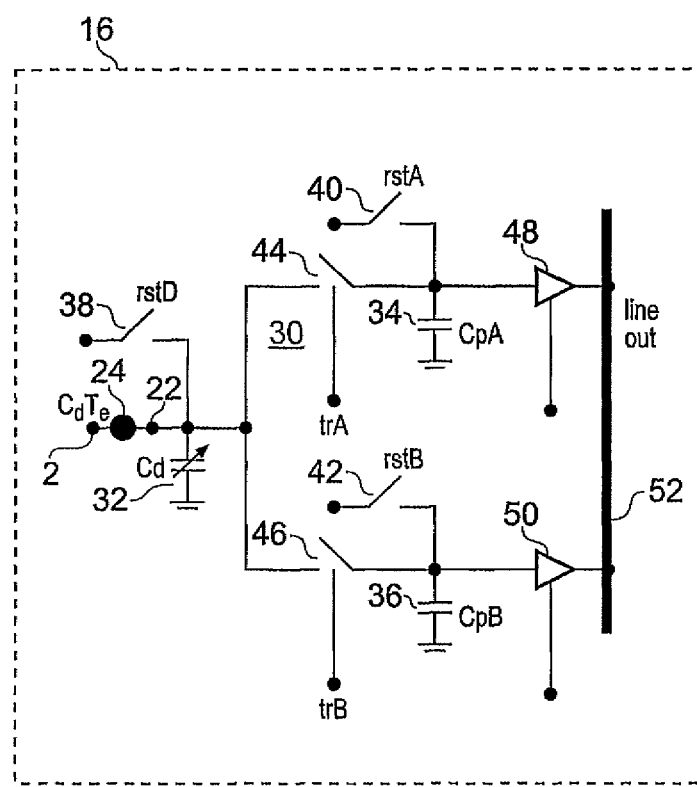
FIG. 3 is a schematic illustration of a read-out circuit for a circuit substrate in accordance with an embodiment of the invention.

Turning now to FIG. 3, there is illustrated a schematic circuit diagram for a read-out circuit 16 in accordance with an embodiment of the invention. In the described embodiment the read-out circuit 16 is a CMOS integrated circuit including capacitance circuitry for integrating charge pulses received from the direct dose detection radiation detector substrate 2.

The charge integration circuitry 30 includes three capacitances, variable capacitance Cd 32 and two other capacitances CpA 34 and CpB 36. Also included in the charge integration circuitry are reset switches 38, 40 and 42 for respectively discharging capacitances Cd, CpA and CpB. Switches 44 and 46 may be operated to couple capacitances CpA and CpB respectively to capacitance Cd. Each capacitance includes a capacitive circuit element which may be a discrete capacitor component or comprise parasite capacitances of other circuit elements, or a combination of both discrete and parasitic capacitances, for example. The capacitances also include resistive circuit elements which may again be discrete components, parasitics or a combination of both types of resistance.

Capacitance Cd is coupled between the circuit contact 22, which is coupled to the $C_dT_e$ detector substrate 2 by a bump-bond 24, and a reference potential which in the described embodiment is ground. It will be evident to the person of ordinary skill that reference potentials other than ground may be used depending upon circuit implementation.

The charge integration circuitry may be operated in two modes. In the first mode switch 44 is closed coupling Cd and CpA together to form a capacitance suitable for capturing charge relating to a single detection event. In the described embodiment the total capacitance in the first mode is 150 fF In the second operational mode, switch 44 is open and a larger capacitance may be formed by increasing the value of Cd and coupling it to CpB by closing switch 46. In the described embodiment switch 46 is left open whilst Cd is charged alone, in order to allow charge previously stored on CpB to be read-out. Once read-out of CpB has been completed then switch 46 is closed and the full second mode capacitance is formed of Cd and CpB. In the second mode the capacitance formed of Cd and CpB is sufficiently large to integrate charge corresponding to several detection events in the corresponding sense volume. In the illustrated embodiment the combined capacitance of Cd and CpB is 300 fF.

In the example embodiment the capacitances CpA and CpB have the same value. This has the advantage that the resultant time constant of the capacitor and read out line resistance are the same facilitating balanced capacitor discharge times and hence readout times.

For the purposes of providing an illustrative example only, the operation of read-out circuitry 16 will now be described for a clock rate of 1 MHz and a 50×50 (2500) array of read-out circuits 16. Such operational parameters provide a theoretical maximum total charge integration time of 2.5 milliseconds per read-out circuit, although in practice some of this time will be used in circuit "housekeeping" such as resetting various capacitances. The operation of read-out circuitry 16 will also be described for ionising radiation flux densities exposure rates up to 4 Gy/hr. For the illustrative flux density range, the variable capacitance Cd is tunable from 50 fF to 200 fF. Evidently, for other flux ranges the range of capacitance over which Cd may be varied will be correspondingly modified. The capacitance needs to be sufficient to allow for the collection of charge resulting from the photo-electric interactions. This is dependent on the energy of the incident photons, the mass transfer coefficient for the detector material at this given energy and the energy required to generate an electron hole pair for the material.

The 50 to 200 fF range for capacitance Cd includes detector substrate parasitic capacitances which for the CdTe based detector substrate 2 are about 30 to 50 fF. Switches trA, trB, rstA and rstB are MOSFET transistor switches, but other switch means may be used, for example other forms of transistor switch. As illustrated, switches trA and trB switch capacitances CpA and CpB respectively into Cd, whilst rstA and rstB switch capacitances CpA and CpB respectively to a reference potential for discharging the capacitances, such as an analogue ground reference potential.

Output buffers 48 and 50 are coupled to the output of the "A" and "B" arms of the charge integration circuitry 30 respectively. Each of buffer 48 and 50 are controllable to output a signal derived from the capacitance in arm A or arm B to an output bus "line-out" 52. The output bus 52 is a two-line bus, in respect of lines from out the output of CpA and CpB respectively.

The output buffers 48 and 50 may comprise simple tri-state buffer circuitry, although optionally the buffers may also comprise additional pre-amplification circuitry.

In one embodiment the output buffers 48 and 50 are configured as a two stage amplifier consisting of a first stage charge amplifier and a second stage differential amplifier attached to line-out 52, where the reference for such amplifiers are taken from a reference dummy read-out circuit, i.e. an unconnected read-out circuit. This allows the amplification to be made relative to ASIC related offset conditions e.g. temperature change. The output from each capacitance CpA and C0 is fed to respective charge amplifiers of two stage amplifiers 48 and 50 to produce a pulse suitable for input on to bus 52. This output then forms the input to the line based differential operation amplifier of each of two stage amplifiers 48 and 50, together with a reference input from the read-out circuit structure unconnected to the detector substrate. The output from these line amplifiers is then received by analogue to digital conversion interface circuitry. The amplifiers 48 and 50 are configured to produce pulses having magnitude or height proportional to the amount of charge collected in respective capacitances CpA and CpB. The amplifiers have good high frequency response in order to be able to handle the sharply-peaked pulses from the capacitances, as well as a high input impedance and linear response to the pulses.

The operation of the read-out circuitry 16 will now be described with reference to the timing diagram illustrated in FIG. 4, as well as the circuit schematic FIG. 3.

The read-out circuitry 16 is operated to provide a charge capture window for arm A in which to capture charge generated by a single detection event in the corresponding sense volume 12. The read-out circuitry 16 is also operated to provide a charge capture window for arm B for capturing plural detection events in the corresponding sense volume 12, and to read-out the charge corresponding to the plural detection events.

Figure 4:
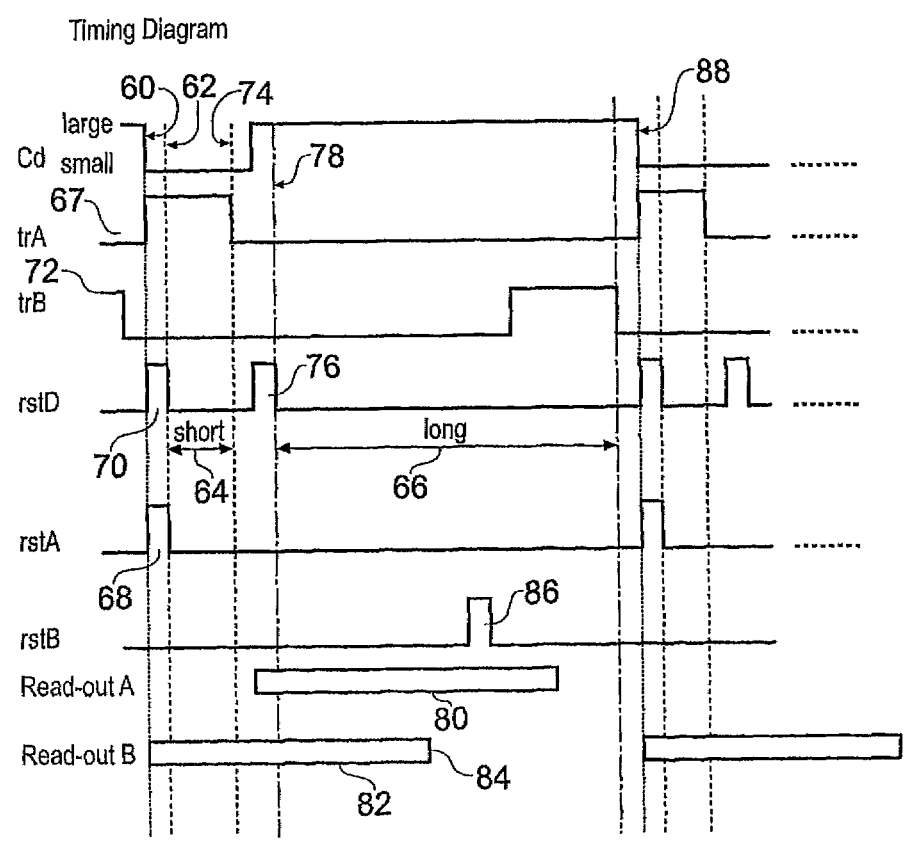
FIG. 4 is a timing diagram illustrating operation of a detector in accordance with an embodiment of the invention.

In the timing diagram illustrated in FIG. 4, the topmost trace Cd, represents switching of the capacitance Cd between a large and small value capacitance corresponding to the capacitance for a long 66 and short 64 charge integration time respectively.

At time 60 Cd is tuned to a value of 50 fF, switch control signal 67 for switch trA is high in order to close switch trA and reset signals rstA 68 and rstB 70 are pulsed to reset capacitances Cd and CpA. Following reset pulses 68 and 70 the short integration window 64 is opened for between 10 about 700 microseconds.

During the short integration period switch signal 72 is low keeping switch trB open, thereby isolating capacitance CpB from the detector substrate. When the short integration period 64 completes, 74, switch signal 67 goes low and opens switch trA thereby isolating capacitance CpA. Read-out of CpA to bus-line 52(A) can then begin, labelled 80 in FIG. 4.

The long integration window is initiated by tuning Cd to the larger capacitance value of 200 fF and sending a reset pulse 76 to reset switch rstD to discharge Cd. The long integration window then begins, 78, and charge corresponding to multiple radiation detection events can be accumulated in Cd. Since the previous read-out of CpB, 82, is still underway when the short integration period finishes, charge is only accumulated in Cd at first in order to avoid any dead-time whilst waiting for the previous read-out of CpB to finish.

Once the previous read-out of CpB is completed, 84, CpB is discharged by asserting reset pulse 86 to reset switch rstB, and switch trB opened by sending signal 72 high thereby connecting CpB to Cd. The combined CpB, Cd capacitor then continues to accumulate charge until the end of the current integration cycle.

For a large value capacitance of 200 fF for Cd, and a fixed value of 100 fF for CpB, Cd is two-thirds of the total capacitance formed of Cd and CpB. Therefore, CpB must be reset before the last third of the long integration window begins in order to avoid Cd from saturating.

Switch signal 72 goes low opening switch trB and closing the long integration charge window 66, and read-out of CpB can begin again. When the 2.5 millisecond charge cycle is completed, 88, the variable capacitance is switched to a small value and the charging cycle is repeated.

The charge integration is interleaved as described above in order to provide sufficient read-out time for the charge values accumulated in respect of capacitance arms A and B. For the same reason, the short integration window must be less than 700 microseconds. The total circuit "dead-time" is minimised with this approach.

Figure 5A:
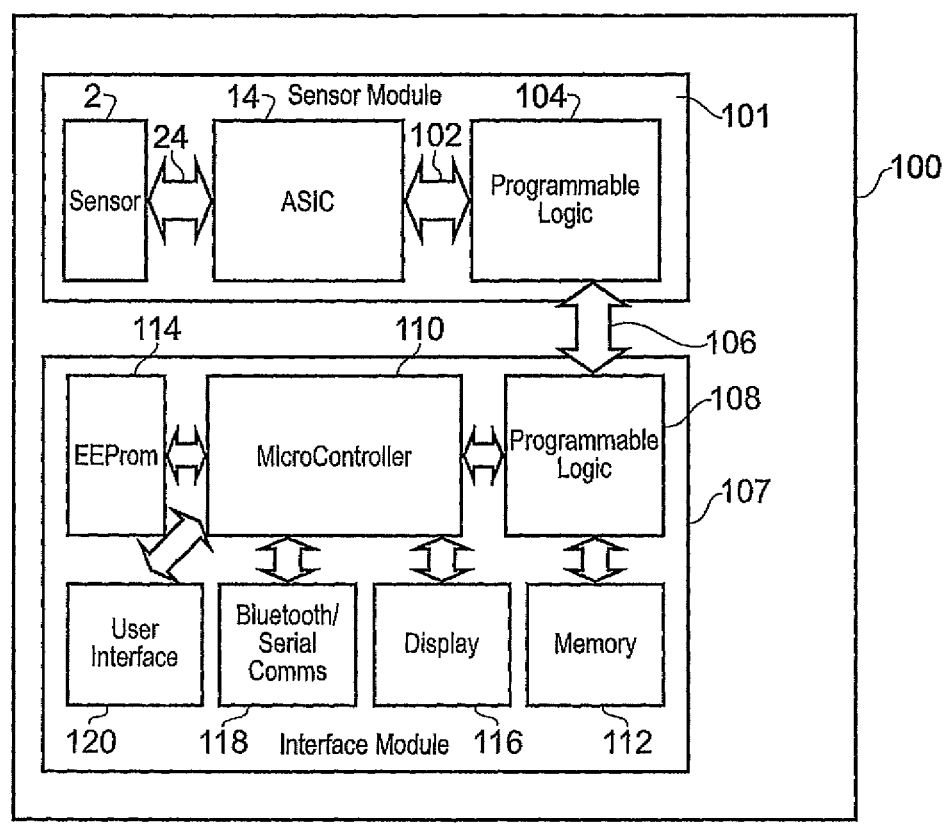
FIG. 5(a) is a block diagram of a detector device in accordance with an embodiment of the invention.

The system modules required in an example of ionising radiation detection device 100 are illustrated in FIG. 5(a). The system module responsible for converting the incoming radiation into digital signals is shown as "sensor module" 101. The sensor-module contains the radiation detector 13 (ASIC circuit substrate 14 bonded to the detector-substrate 2) and a number of support chips 104 having the logic required to provide a control interface. An expanded view of the various components contained within the sensor module is show in FIG. 5(b)

Figure 5B:
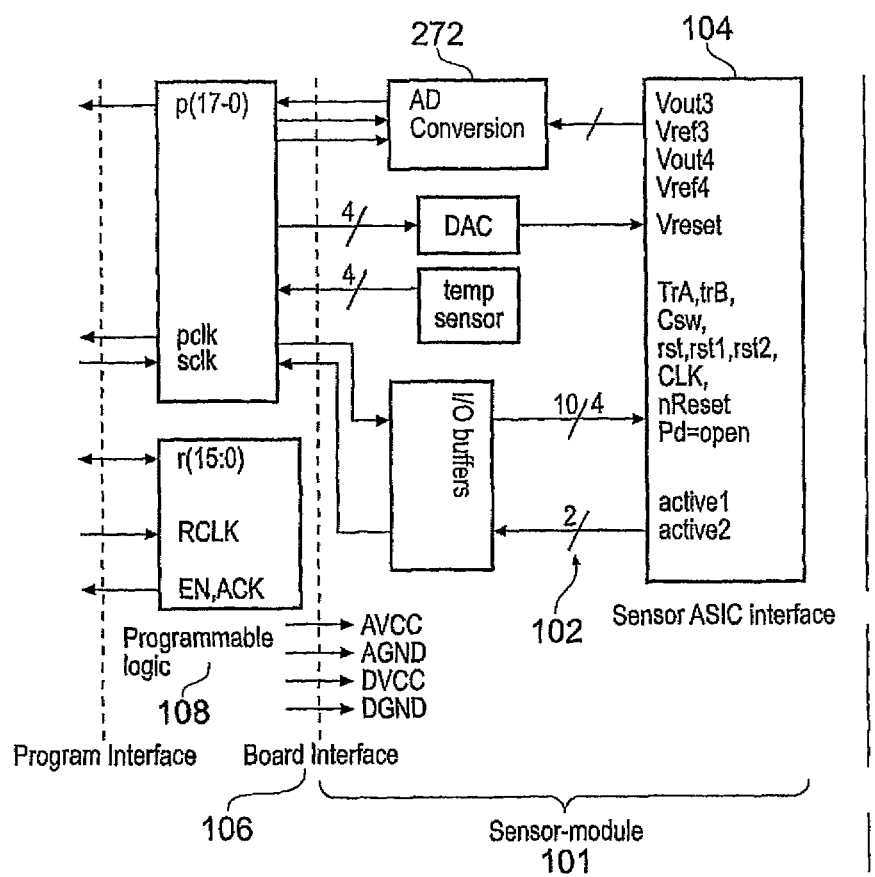
FIG. 5(b) is a schematic illustration of a sensor-module for a detector device in accordance with an embodiment of the invention.

The analogue data received from the ASIC circuit 14 is converted to digital form via the A/D converter 272 shown in FIG. 5(b). The A/D conversion has two channels. The conversion results are transferred through a connector in serial mode across data bus 106 to programmable logic 108 on interface module 107. The programmable logic 108 stores the radiation data in memory 112 and interfaces with the micro-controller 110. Micro-controller 110 controls all the elements of the ionising radiation detection device 100, for example memory management (102), display (116), communications (118) and user interface (120). Additionally, micro-controller 110 is configured by programs stored in EEP-rom 114. Typically, program logic 108 is configured as a field programmable gate array (FGPA). In addition to containing the interface logic to control the ASIC, the FGPA 108 would normally also contain an implementation of the device calibration algorithm, which ensures that the short and long converted values are directly related to incident photon energy and cumulative exposed dose respectively. Under microprocessor control 110 the short integration calibrated values are used to form a cumulative normalised spectrum, incorporating information from the recent past. The calibrated long integration values are used to form an estimate of the dose rate and the cumulative amount of radiation received over an historic period. The start point of the cumulative dose calculation is programmatic. The dose rate information is used to adjust the length of the short integration period, to maintain the likelihood of capturing single events. The spectroscopic information is used as the basis for isotopic identification. This can be either carried out by the controlling micro-processor or performed off the device using external processing power.

The data from micro-controller 110 may be transmitted to a remote location using the communications module 118. The communications module 118 may be a wire-based communications module, or a wireless-based communications module, typically for a local area network where low power radio communication is suitable, such as Bluetooth. Optionally, wire-based communication may be over much greater area, and the communications module 118 configured to comprise a higher power radio unit such as a cellular telephone transceiver or alternatively be linked to such a device via the local short distance wireless link.

The ionising radiation detection device 100 also includes a user interface 120, for providing user input controls to the device such as on/off functionality, and options for displaying various types of information.

Typically the components on the sensor-module are low power, which is particularly important for a portable detector, and it is particularly advantageous if powers saving techniques are implemented in order to minimise power consumption when no radiation is present.

Figure 6:
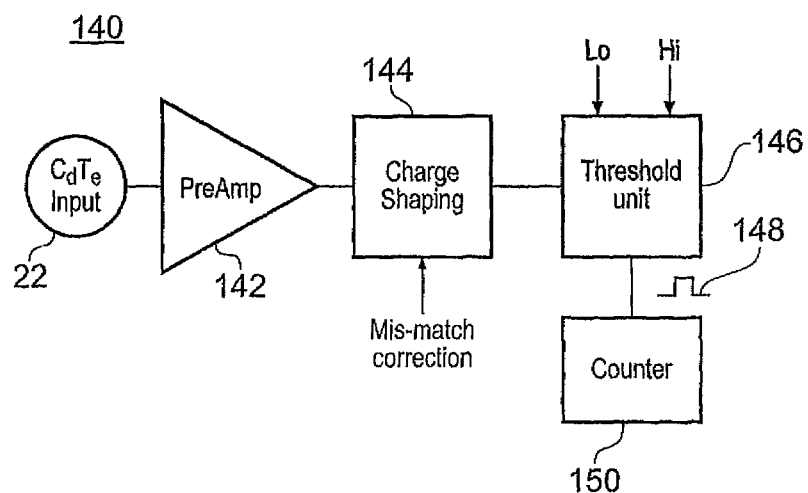
FIG. 6 is a schematic illustration of a read-out circuit in accordance with a second embodiment of the invention.

A different technology may be used for recording and measuring charge produced in the detector substrate 4, to that described in connection with FIGS. 3 and 4 above. In this technology the charge integrating circuitry 16 illustrated in FIG. 3 is replaced by photon-counting circuitry 140 as illustrated in FIG. 6. In one embodiment a current pulse corresponding to charge received from a corresponding sense volume 12 via contact pad 22 is input to pre-amplifier 142. The current pulse is amplified in pre-amplifier 142, which has a fast response characteristic in order to handle the short highly-peaked current pulses produced by sense volume 12.

The amplified current pulse is then input to a pulse-shaping amplifier 144. As shown the amplifier includes inputs to compensate for mis-match errors that may have altered the amplifier characteristics. Mis-match errors are introduced by small misalignments of the various layers that comprise a silicon chip. The shaped current pulse is then input to a threshold unit 146.

Threshold unit 146 has two threshold levels, Lo and Hi, which may be pre-set, pre-programmed or variable during use of the circuitry. The threshold levels may be used to set minimum and maximum current levels such that any pulse falling in the range set by the threshold levels trigger an output pulse 148 from threshold unit 146 to count circuitry 150.

The count circuitry 150 may be any suitable circuit configuration. The maximum count provided by such circuitry will depend on the specific application for which the detector is intended but the 8- to 10-bit counter will typically be sufficient to avoid counter saturation before the counter would be read-out. An example of the circuit architecture for photonic counting may be found at the following URL—http://medipex.web.cern.ch/MEDIPEX/ and from the MEDIPEX project run by CERN (the European Organisation for Nuclear Research) R&D of 1211 Geneva, Switzerland which uses photon-counting circuitry for medical imaging).

In accordance with an embodiment of the present invention an array of photon-counting circuits 140 is coupled to a detector substrate 2 as illustrated in FIG. 1, wherein each photon-counting circuit 140 is respectively coupled to a sense volume 12 of an array of sense volumes. The threshold unit 146 of the photon-counting circuitry 140 may be configured to provide spectroscopic or isotopic information for the incident radiation.

The threshold levels can be set so that the threshold unit 146 only triggers a pulse 148 for an input current pulse corresponding to a particular type of radiation, for example from a $U_{235}$ or $Cs_{137}$ source. Thus, the nature or isotopic source of the incident ionising radiation may be determined.

A sensor module 2 comprising an ASIC 14 having photon-counting circuitry may be driven in a number of different ways to yield spectroscopic data on the incident radiation.

Three general examples of sensor operation will now be described.
  1) Successive frame scanning
    a. Progressive
    b. Optimised Search
  2) Region Tuning
    a. Dynamic
    b. Fixed
  3) Dynamic Peak Search 1) a. In successive frame scanning the two threshold parameters are adjusted for each successive frame read-out of the ASIC 14. Thus, each frame can window a different section of the ionising radiation spectrum. The windowing can be progressive, each successive window being an increment in the energy spectrum on the previous window. Thus an energy spectrum can be derived and isotopes identified from their characteristic peaks in the conventional manner using one of the many known isotope identification algorithms.

1) b. Alternatively, the successive frames can be tuned to isolate the most discriminative sections of the spectra (Optimised Search). Peaks and relative peak heights found in such regions quickly eliminate large numbers of potential isotopes permitting an optimised search algorithm to quickly identify the correct isotope as the source of the ionising radiation.

2) a. A variation of successive frame scanning is to tune different parts of the ASIC to different parts of the spectrum. Clearly this method, which is termed region tuning, has the advantage of searching for regions of the spectrum in parallel. It is equivalent to using multiple frame scanning devices in tandem. Of course the parallel search is obtained at the expense of sensitivity as the area searching the different sections of the spectrum is reduced from an entire detector to a tuned region on that detector. Whether this is advisable is dependent on the incident fluence levels and the overall detector area.

2) b. One possible variant of region tuning would be to have the tuned regions fixed for a particular ASIC i.e. the ASIC is dedicated to the identification of a particular isotope or isotopes (Region Tuning Fixed). The output from multiple such devices can be used in tandem to decide on the most likely source of incident radiation.

3) The Dynamic peak approach adopts a coarse to fine refinement approach to the derivation of the resultant spectrum. Initially the window levels are set to relatively coarse, wide, regions of the energy spectrum. This is refined dynamically by reducing the energy width to reveal additional spectral detail.

Clearly, the search procedures outlined above are not mutually exclusive nor exhaustive. Rather the various approaches provide an algorithmic toolbox that can be mixed and matched as appropriate to provide the most efficient isotope identification mechanism for a particular application.

FIG. 7 schematically illustrates how a sensor array and circuit substrate array may have different areas linked to different parts of the spectrum. Each number "1", "2", "3" and "4" represents a photon-counting circuit set to respective regions of the spectrum. As can be seen in 7(*a*) the differently thresholded counting circuits can be distributed on an individual circuit basis, or as clusters 7(*b*) or as linear arrays 7(*c*). The energy regions may be fixed or tunable.

An application of a detector device 100 utilizing either charge integration circuitry as described with reference to FIG. 3 and FIG. 4 or photon-counting circuitry as described with reference to FIG. 6 is as a personal dosimeter. One example of a personal dosimeter product is illustrated in FIG. 8. The illustrated personal dosimeter 180 is known as an Isotopic Personal Dosimeter™ (IPD) due to the fact that it can discriminate between different ionising radiation energies. The dosimeter is battery powered, either by conventional dry cell battery or a rechargeable battery.

Such an IPD may be used by emergency services personnel or other persons who are first to respond to and likely to enter into hazardous situations such as areas having suffered a terrorist attack or nuclear accident, and therefore the described product may find particular utility with Homeland Security or UK Resilience organizations. It may be used by other persons also.

A particular feature of the IPD is that it is small and light enough to be hand held or wearable.

Radiation monitoring and detecting standards for which the IPD has been designed include: ANSI n40's; n42.32, Alarming; n42.33, Type 2; and n42.34, Isotope Identification.

Viewed from the side there can be seen an activation button 182 for controlling the device 180. In one embodiment a first touch activates the device 180 and illuminates its display (LED or LCD) for five seconds allowing sufficient time for the radiation in the environment to be detected, displayed and the output read before the device goes into a "battery save" mode. A second touch of button 182 within 5 seconds of the first touch changes the format of the displayed information.

The display 184 can be seen from the front view of the device 180. In the illustrated arrangement the lighter grey region 186 to darker grey region 188 represents a colour LED display changing from green through to yellow to orange and finally red. A green display indicates a safe level of radiation whilst red indicates a dangerous level of radiation. A second display 190 displays battery charge level 192, and a device identity number 194.

Figures 8A, 8B:
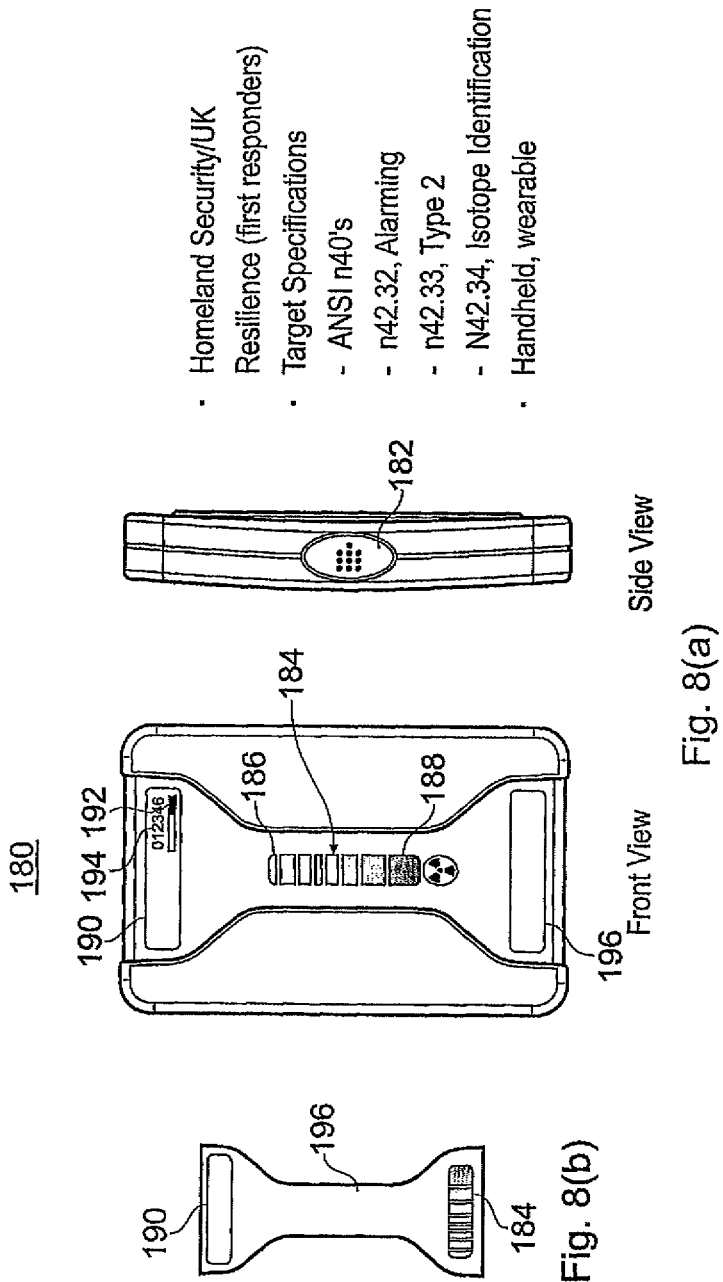

The radiation window for allowing ingress of radiation to the sensor model 13 is labelled 196. An optional arrangement for the displays and radiation window is illustrated in FIG. 8(b).

Another example of an application for embodiments of the present invention is in personnel and area radiation monitoring for health and nuclear physics environments. An example of a product designed for such an application is illustrated in FIG. 9.

The device 200 is designed to be small and light weight, around 50 to 60 grams, in order to be carried or worn without discomfort, or easily mounted on a wall or portal. The casing 202 is of a durable high resistance ABS plastic which is both light and strong. A control switch 204 is mounted on the topside of the device, alongside a display 206. The control switch may have the same functionality as the control switch described with reference to FIG. 8 above.

In the illustrated example the device doubles as an identity card 208, and locks the identify function to the monitoring function. In health and nuclear physics real-time dose and dose rate monitoring is important as well as the recording of historic dose. Therefore, not only does the device include both audible and visual alarms should the device detect a dose or dose rate exceeding a safe level, but also has an internal memory for maintaining an historic record of the dose detected over time. For example, a dose record may be stored in the form of a histogram with the dose per day or week recorded for each column of the histogram. The record of dose can be linked to a particular individual due to the additional ID functionality of the device 200.

The monitoring device 200 typically operates over the range 5 KeV-6 MeV and has a battery life of about five years, for example 10000 hours operational time. The device measures, stores and displays radiation dose and dose rate, for example a deep dose equivalent to Hp10, and has a linear response for doses up to 400 roentgen per hour. Hp10 is defined by IEC 61526 (International Electrotechnical Commission 61526) which is the first international standard covering dosimeters worn on the trunk of the body. This standard introduced the use of Hp(10) and Hp(0.07) (deep tissue and surface tissue equivalent doses)].

The device also has a self-testing battery for determining charge level, and also self-tests the detector and other operational parameters in order to warn a user if a device is operating outside its correct operational parameters.

A particularly useful feature of the device is a telemetry unit or interface unit which allows the dose data stored in the device to be downloaded to a dosimeter reader which may be coupled to a central computer system for centralized record keeping and monitoring of the radiation dose recorded by the device. A wireless telemetry unit may also be provided for remote updating of the centralized computer system.

An example of a wearable product is illustrated in FIG. 10. Although the device illustrated in FIG. 10 is a wearable version of the dosimeter 180 illustrated in FIG. 8, a detector device as illustrated in FIG. 9 may also be configured as a wearable device. In one embodiment the device is configured to be worn on a wrist strap 210 and held in place by retention members 212 and 214. It is particularly advantageous if the retention numbers 212 and 214 are able to removably retain the device 180 in order for broken devices to be replaced, or for ease of servicing such as battery replacement. Device 180 has many of the features described in connection with device 200. However, a particularly useful enhancement with a wearable device is position sensing apparatus. For example, a global positioning satellite system. This would allow a user of the device to have that position monitored and a record of the device position coupled to the radiation dose recorded. For a device incorporating a teledosimetry unit, in particular a wireless teledosimetry unit, it would be possible for radiation dose information and positional information to be communicated to a central control station in order to provide real-time radiation level and position monitoring. This would be particularly useful in so-called "plume trail" analysis.

The dosimeters and radiation detectors described with reference to FIGS. 8-10 need not be restricted to personal or personnel radiation monitoring, but may be distributed over a wide area to provide wide area environmental radiation monitoring and detection.

For example, as part of a Homeland Security application or anti-terrorist system, dosimeters may be distributed throughout an urban environment 220, such as diagrammatically illustrated in FIG. 11. The urban environment includes a number of buildings 222 and other typical urban structures such as street lamps 224 and traffic lights 226. Detectors 100 are placed on the various urban structures and either linked, for example over a telephony system 228, or wireless linked, for example over a cellular telephone system although other radio communication systems may be used, to a control and monitoring center 230. Such an arrangement comprises a wide area radiation detection and monitoring network. The network may be enhanced by security or police personnel 232 wearing detectors 100 which are in wireless communication with the control and monitoring centre 230.

Radiation levels, dose and dose rates may be communicated from each of the detectors 100 to the control and monitoring center which is able to produce a map of radiation levels throughout the urban environment 220. The static devices may identify themselves by means of a unique identity which is linked to a particular location so that the control and monitoring center knows the location of each device.

Actually, they may be fitted with position sensing circuitry and communicate their position to the control and monitoring centre.

Devices 100 worn by security or police personnel for example have position sensing circuitry in order that the position of the worn device may be communicated to the control and monitoring centre as the personnel travel through the urban environment 220.

A particular advantage of security or police personnel wearing a device, particularly if configured to respond to particular types of energy such as that emitted from controlled or dangerous substances, is that it allows for ad hoc detection of criminal persons within the street. For example, a criminal or terrorist engaged in seeking to create a nuclear incident or possibly carrying $U_{235}$ tipped bullets would emit corresponding radiation which may be picked up by a detector. A suitable alarm would alert security personnel to the presence of such radiation and they could identify the person from which the radiation is emitting and detain them.

FIG. 12 diagrammatically illustrates another application of an embodiment of the invention. This application envisages the use of wearable dosimeters and detector devices 100 by emergency services 240. The devices 100 all have wireless communication units which link them to the command and control centre 230. Typically the command and control centre will be a mobile unit close to or adjacent to the area where the emergency incident has taken place, and relatively low power wireless communications may be used, for example over a blue tooth network.

In the illustrated example, a nuclear incident has occurred where a hazardous source of radiation 242 has been released. As emergency personnel 240 move around the environment, for example attacking fires which have resulted from the incident giving rise to the exposure of the radiation source 242, the radiation to which they are exposed may be monitored and the levels relayed to command and control centre 230. In this example, it is preferable that each detector device 100 incorporates position sensing circuitry in order that the wearer's position may be monitored and position information accompanying each reading of radiation levels recorded.

It is particularly advantageous if the devices 100 also include a bi-directional data channel so that instructions and commands may be sent from the command and control centre 230 to the users of the wearable devices, for example in order to instruct them to move away from an area in which there are hazardous levels of radiation.

For both the network illustrated in FIG. 11 and FIG. 12 the command and control centre 230 includes a system for automatically displaying the location and radiation levels monitored over the network. An example of such a display is illustrated in FIG. 13. The display may be a graphical display on a cathode ray tube or LCD Flat Panel Monitor 250. Indicia of the device ID and dose 252 are displayed on the monitor 250. There are various modes of display. For example, a continuous update of dose and position may be provided in the indicia 252 such that there is dynamic tracking of each device and current radiation level. Optionally, the display 250 may continue to display previous displayed indicia in order that the movement and radiation dose of individual units may be monitored. This would assist in "plume analysis". Additionally, a user of the control system would be able to determine whether or not a wearer of a particular detector device was moving towards a hazardous region, and communicate with them over the voice channel to instruct them to change direction.

It will be evident to persons of ordinary skill in the art that other display configurations and analysis may be employed.

In view of the foregoing description of particular embodiments of the invention it will be appreciated by a person skilled in the art that various additions, modifications and alternatives thereto may be envisaged.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependent claims may be combined with those of the independent claims and features from respective independent claims may be combined in any appropriate manner and not merely in the specific combinations enumerated in the claims.

References

1. H. H. Barrett, J. D. Eskin and H. B. Barber, Phys. Rev. Lett. 75 156 (1995)
2. J. D. Eskin, H. H. Barrett and H. B. Barber, J. Appl. Phys. 85 647 (1999)

Further embodiments of the invention may also be described as follows. Features disclosed in the following may be combined with features of the embodiments described above, or vice versa, to form yet further embodiments of the invention.

A calibrated semi-conductor based high energy radiation monitoring and measuring device and associated real time monitoring system. The device based on a semi-conductor detector using a hybrid system consisting of a detector substrate/layer and semi-conductor recording layer joined together using a direct coupling methodology. The semi-conductor hybrid is an array of pixel detector hexagonal or rectangular in shape cells on a radiation sensitive substrate, each of which responds to incident radiation by generating a charge which is caused by an electron hole pair and collected by applying a bias using an electrode. The semi-conductor substrate is formed of pixelated array that matches the pixelated detection layer substrate. The combination or hybridisation of the detection substrate and the semi-conductor substrate represents a pixel cell for measuring purposes; each pixel cell is calibrated against a known flux of radiation energy and photon-count.

Each pixel cell consists of a charge accumulating or photon-counting circuit directly resulting from the incident ionising radiation. Each pixel cell has associated read-out circuitry and calibration circuitry to enable a calibrated known output for a measured incident radiation dose or incident.

In the case of photon-counting circuitry each pixel, line of pixels or defined area of pixels, is able to have defined a multiplicity of energy threshold limits. The energy levels for each pixel, line or area is able to be defined independently on a pixel, line or area basis. The associated circuitry can be reset to measure and monitor incident radiation in real time. Each pixel cell can determine the energy level into which an incident photon belongs and increment a counter if required.

In the case of charge accumulating circuitry, each pixel cell has an adequate charge carrying capacity to enable high flux bursts to be measured and monitored. The accumulating circuitry will be configured such that the charge collection will be the result of a single photon interaction. In such cases the resultant charge held in each pixels may be converted to a multi-spectral read-out.

Each defined detection cell is thus capable of spectroscopic of multi-energy read-out in real time. Attached to the device are memory and/or an interface for a display, fixed connection or wireless connection to a monitoring and recording system and associated software to allow real time and historic recording of the incidence of radiation on the monitoring and measuring device.

Further aspects and embodiments of the invention will now be enumerated by the following numbered paragraphs.

1) A hybrid semi-conductor device for monitoring and measuring radiation using an array of delineated recording cells such device comprising a detector substrate or substrates according to the ionising radiation to monitored or measured. The detector substrate divided into an array of detecting areas or cells—hexagonal, octagonal or rectangular in shape which directly records an ionising interaction through charge generation. The detector substrate is directly connected to a semi-conductor recording or read-out circuit; the said circuit having a corresponding cell type structure. Thus the combination of the detection layer and recording layer forms a unique record of an interaction of ionising radiation and an area on/in the device.

The read-out/recording cell comprises of a circuit to each measure accumulated charge or photon activity directly resulting from the interaction of ionising radiation within the defined "detector cell". This can further be recorded by energy of interaction using a threshold level detector circuit and by banding said circuits in either stripes, blocks or cell groupings and having ascending or descending layered steps.

The recording circuit furthermore contains electronic circuits to control and manage the read-out to an external circuit the count or accumulated charge associated with the monitoring and measurement. The organisation of the detecting structure and associated electronic circuits is such that the circuit design will be sufficient to record transient high energy peaks without saturating.

2) The semi-conductor hybrid of paragraph 1 will have a property such that each cell shall be delineated and separated by the inclusion of an insulating material so that each recording cell is seen to be unique in event recording capability. This to also include the isolation of the cell electrically from other cells.

3) The structure of the hybrid in paragraph 1 using an array of delineated recording cells such device comprising a detector substrate or substrates according to the ionising radiation to monitored or measured. The detector substrate divided into an array of detecting areas or cells—hexagonal, octagonal or rectangular in shape which directly records an ionising interaction through charge generation. The detector substrate is directly connected to a semi-conductor recording or read-out circuit; the said circuit have a corresponding cell type structure. Thus the combination of the detection layer and recording layer forms a unique record of an interaction of ionising radiation and an area on/in the device.

The read-out/recording cell comprises of a circuit to each measure accumulated charge or photon activity directly resulting from the interaction of ionising radiation within the defined "detector cell". This can further be recorded by energy of interaction using a threshold level detector circuit and by banding said circuits in either stripes, blocks or cell groupings and having ascending or descending layered steps.

The recording circuit furthermore contains electronic circuits to control and manage the read-out to an external circuit the count or accumulated charge associated with the monitoring and measurement. The organisation of the detecting structure and associated electronic circuits is such that the circuit design will be sufficient to record transient high energy peaks without saturating.

4) The pixel cell recording structures of paragraph 1 through 3 may be grouped together to form a tessellated recording area—this can be in the form of lines or areas of pixel recording cells (a superpixel)—that operate in a time-based sequence such that any point in time one or more of the tessellated areas may be in registering energy whilst others may be in read-out mode.

5) Each pixel recording cell structure or tessellation or group in paragraph 1 through 4 may have energy-defined thresholds associated with it defining a number of energy levels.

6) The thresholds defined in paragraph 5 may be fixed in the circuitry of the hybrid electronics or varied dynamically.

7) Each pixel recording cell structure or tessellations or group in paragraph 1 through 4 may be configured such that the charge collection will correspond to a single photon interaction.

8) The recording cell defined in paragraph 7 may be configured to contain circuitry relating the stored charge to incident photon energy, the functionality of this process may be parameterised.

9) The recording cell defined in paragraph 7 may be configured such that the process of relating stored charge to incident photon energy takes place externally to the recording cell.

10) The superpixel defined in paragraph 4 may have one set of threshold values or be subdivided into areas of differing thresholds, the ultimate area being a single pixel recording cell. Spatial resolution may thus be sacrificed for sensitivity.

11) The semi-conductor will be incorporated in a device package with other electronics and will have the ability to transmit using Bluetooth or wireless networking capability or other communications methodologies, the record of radiation incident on the detector substrate in real time. Furthermore the device will be able to store information in a memory in time and intensity such that it can be downloaded at a base station or cradle assembly at a convenient point in time, said cradle will also form the basis of a battery charging platform.

12) The recording device or device package may be able to be operated remotely from a power source and may be battery cell powered.

13) The packaged device of paragraph 10 will form part of a computer system that is used to record on a real-time basis and also provide an historic record of dose and intensity of radiation over a period of time. Each device in paragraph 4 will have a unique identity.

The invention claimed is:

1. An assembly for monitoring radiation, comprising:
a detector substrate for generating electronic charge responsive to incident radiation, said detector substrate configured to form an array of ionising radiation sense volumes; and
a circuit substrate supporting an array of read-out circuits corresponding to said sense volumes; wherein
a first of said read-out circuits includes photon counting circuitry electronically configurable to respond to a current pulse corresponding to the detection in a corresponding first radiation sense volume of ionising radiation in a first energy range in a first detection period to increment a first count value, and a second of said read-out circuits including photon counting circuitry electronically configurable to respond to a current pulse corresponding to the detection in a corresponding second radiation sense volume of ionising radiation in a second energy range in a second detection period to increment a second count value;

wherein said first detection period corresponds to a first frame read-out cycle in which said photon counting circuitry is operative to increment said first count value responsive to detection of ionising radiation in a first window corresponding to said first energy range, and said second detection period corresponds to a second frame read-out cycle in which said photon counting circuitry is operative to increment said second count value responsive to detection of ionising radiation in a second window corresponding to said second energy range, wherein said first and second read-out circuits are operative to read-out frames successively in progressive scanning of successive frames and wherein said second energy range is different from said first energy range;

wherein said photon counting circuitry comprises threshold circuitry including a lower current threshold level and an upper current threshold level for defining one or other of said first energy range and said second energy range, said threshold circuitry configured to output a count pulse to said photon counting circuitry responsive to a current pulse having an amplitude within the range defined by said upper current threshold level and lower current threshold level, and wherein said threshold circuitry is operative to adjust said lower current threshold level and said upper current threshold level for each successive read-out cycle such that, in progressive scanning of successive frames, said second window is an increment in the energy spectrum on the previous window.

2. An assembly for monitoring radiation, comprising:
a detector substrate for generating electronic charge responsive to incident radiation, said detector substrate configured to form an array of ionising radiation sense volumes; and
a circuit substrate supporting an array of read-out circuits corresponding to said sense volumes; wherein
said read-out circuits comprise photon counting circuitry electronically configurable to respond to a current pulse corresponding to the detection in said detector substrate of ionising radiation in a first energy range in a first detection period to increment a first count value or to respond to a current pulse corresponding to the detection in said detector substrate of ionising radiation in a second energy range to increment a second count value in a second detection period;
wherein said first detection period corresponds to a first frame read-out cycle in which said photon counting circuitry is operative to increment said first count value responsive to detection of ionising radiation in a first window corresponding to said first energy range, and said second detection period corresponds to a second frame read-out cycle in which said photon counting circuitry is operative to increment said second count value responsive to detection of ionising radiation in a second window corresponding to said second energy range, wherein said first and second read-out circuits are operative to read-out frames successively in progressive scanning of successive frames and wherein said second energy range is different from said first energy range ;
wherein said photon counting circuitry comprises threshold circuitry including a lower current threshold level and an upper current threshold level for defining one or other of said first energy range and said second energy range, said threshold circuitry configured to output a count pulse to said photon-counting circuitry responsive to a current pulse having an amplitude within the range defined by said upper current threshold level and lower current threshold level, and wherein said threshold circuitry is operative to adjust said lower current threshold level and said upper current threshold level for each successive read-out cycle such that, in progressive scanning of successive frames, said second window is an increment in the energy spectrum on the previous window.

3. An assembly according to claim 1, wherein said detector substrate comprises semi-conductor material.

4. An assembly according to claim 2, wherein said detector substrate comprises semi-conductor material.

5. An assembly according to claim 1, wherein said circuit substrate comprises semi-conductor material.

6. An assembly according to claim 2, wherein said circuit substrate comprises semi-conductor material.

7. An assembly according to claim 1, wherein said sense volumes comprise a cross-section area in the range between 20 μm×20 μm×0.25 mm to 2 mm×2 mm×5 mm.

8. An assembly according to claim 2, wherein said sense volumes comprise a cross-section area in the range between 20 μm×20 μm×0.25 mm to 2 mm×2 mm×5 mm.

9. The assembly of claim 1, further comprising a semi-conductor detector substrate crystal configured with a plurality of ionising radiation sense volumes, said detector substrate crystal supporting conductive material across a first surface thereof and an array of conductive pads disposed across a second surface thereof opposing said first surface thereby defining said plurality of sense volumes.

10. The assembly of claim 2, further comprising a semi-conductor detector substrate crystal configured with a plurality of ionising radiation sense volumes, said detector substrate crystal supporting conductive material across a first surface thereof and an array of conductive pads disposed across a second surface thereof opposing said first surface thereby defining said plurality of sense volumes.

11. An assembly according to claim 1, wherein the assembly is part of an ionising radiation monitoring device in a radiation monitoring network, the network further comprising:
a communications unit for communicating at least radiation data corresponding to radiation sensed by said device over a communications network; and
a control station configured to receive said radiation data from said device.

12. An assembly according to claim 2, wherein the assembly is part of an ionising radiation monitoring device in a radiation monitoring network, the network further comprising:
a communications unit for communicating at least radiation data corresponding to radiation sensed by said device over a communications network; and
a control station configured to receive said radiation data from said device.

13. A method for monitoring radiation, the method comprising:
configuring photon-counting circuitry to respond to a current pulse corresponding to the detection of ionising radiation in a first energy range in a first detection period to increment a first count value, wherein said first detection period corresponds to a first frame read-out cycle in which said photon counting circuitry is operative to increment said first count value responsive to detection of ionising radiation in a first window corresponding to said first energy range;
configuring said photon-counting circuitry to respond to a current pulse corresponding to detection of ionising radiation in said second energy range in a second detection period to increment a second count value, wherein said second detection period corresponds to a second frame read-out cycle in which said photon counting circuitry is operative to increment said second count value responsive to detection of ionising radiation in a second window corresponding to said second energy range;

configuring threshold circuitry to define a lower current threshold level and an upper current threshold level for defining one or other of said first energy range and said second energy range;

outputting a count pulse to said photon-counting circuitry responsive to a current pulse having an amplitude within the range defined by said upper current threshold level and lower current threshold level;

adjusting said lower current threshold level and said upper current threshold level for each successive read-out cycle such that, in progressive scanning of successive frames, said second window is an increment in the energy spectrum on the previous window;

reading said count values from each of said photon-counting circuitry configured for said first or second energy ranges successively in progressive scanning of successive frames.

14. A method according to claim 13, the method further comprising:

receiving spectroscopic data representative of the energy of sensed radiation from a remote ionising radiation sensor over a communications network; and automatically determining from said spectroscopic data if said radiation is hazardous and issuing a warning signal if said radiation is hazardous.

\* \* \* \* \*